United States Patent [19]

Ehlers

[11] 4,140,943
[45] Feb. 20, 1979

[54] PLASMA GENERATING DEVICE WITH HAIRPIN-SHAPED CATHODE FILAMENTS

[75] Inventor: Kenneth W. Ehlers, Alamo, Calif.

[73] Assignee: The United States of America as represented by the United States Department of Energy, Washington, D.C.

[21] Appl. No.: 802,401

[22] Filed: Jun. 1, 1977

[51] Int. Cl.$^2$ .......................... H01J 7/24; H05H 1/00
[52] U.S. Cl. .................................. 315/111.4; 313/155; 313/161; 313/231.4; 313/362
[58] Field of Search ............ 313/362, 363, 155, 231.3, 313/231.4, 161; 315/111.3, 111.4

[56] References Cited

U.S. PATENT DOCUMENTS

| | | | |
|---|---|---|---|
| 3,156,090 | 11/1964 | Kaufman | 313/362 X |
| 3,551,828 | 12/1970 | Stengel | 313/161 X |
| 3,760,225 | 9/1973 | Ehlers et al. | 313/363 X |
| 3,969,646 | 7/1976 | Reader et al. | 313/362 X |

*Primary Examiner*—Palmer C. Demeo
*Attorney, Agent, or Firm*—Dean E. Carlson; R. S. Gaither; L. E. Carnahan

[57] ABSTRACT

A device for generating a homogeneous ion-electron plasma from which a large ion beam can be extracted. The device utilizes hairpin-shaped filaments lining at least portions of the wall of the chamber which have been rotated 90 degrees from prior known approaches. This provides a very significant result in that the DC current flowing through the filaments produces a small solenoidal magnetic field that impedes the emitted electrons from striking the walls of the chamber, which may be of a cylindrical or rectangular configuration. This improves the efficiency of the ion source and provides additional space for more filaments, while providing a very uniform plasma density profile which is noise-free.

5 Claims, 9 Drawing Figures

PRIOR ART
FILAMENT
ARRANGEMENT

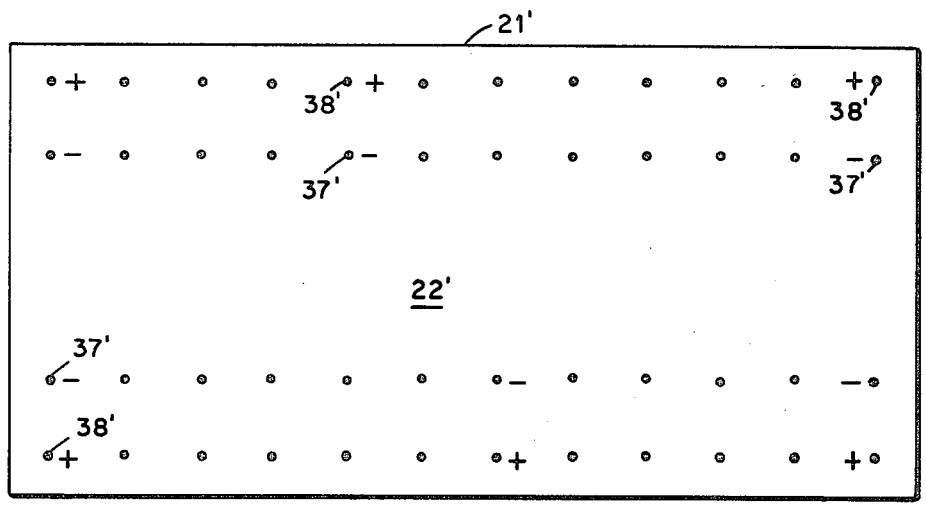
Fig. 6
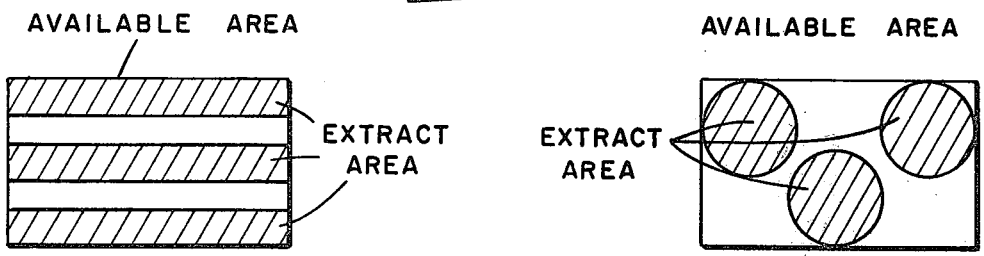
Fig. 7
Fig. 8
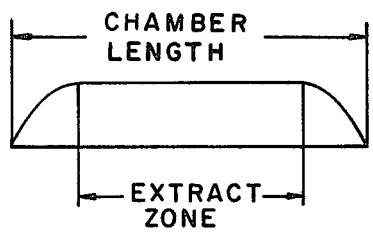
Fig. 9

PLASMA GENERATING DEVICE WITH HAIRPIN-SHAPED CATHODE FILAMENTS

BACKGROUND OF THE INVENTION

The invention described herein was made in the course of, or under, Contract No. W-7405-ENG-48 with the United States Energy Research and Development Administration.

The invention relates to an improved plasma generating device, and more particularly to such a device wherein the filaments thereof are arranged to produce a small solenoidal magnetic field that prevents or impedes the emitted electrons from striking the walls of the chamber.

In the past various plasma generating devices have been designed as exemplified by U.S. Pat. Nos. 2,785,311 to Lawrence, 2,902,614 to Baker, 3,760,225 to Ehlers et al, and 3,846,668 to Ehlers et al. The plasma generating device of U.S. Pat. No. 3,846,668, for example, generally comprises a plurality of electron emitter dc-heated filaments and an annular shaped anode disposed in outwardly spaced and circumjacent relation to the plurality of emitter elements so as to cause a gaseous medium upon introduction into the discharge chamber of the device to be progressively formed into a homogeneous plasma for effecting fueling and heating of a thermonuclear reactor with minimal difficulties.

The next generation of fusion systems, which includes TFTR, MX, Doublet III, Tokamak, etc., will utilize neutral-beam injection for plasma heating. For example, the MX system will use 80-keV, 0.5 sec. modules injecting a total of 750A (equivalent) of D atoms with a mean energy of 56 keV; the TFTR (Tokamak Fusion Test Reactor) requires 20 MW of 120-keV D atoms in 0.5 sec. pulses at 5-minute intervals from a total of 12 individual neutral-beam modules.

The plasma generator, or ion source, for example, has to provide a hydrogen or deuterium ion-current density of 0.25 to 0.5 A/cm$^2$, with combined spatial and temperal variations less than $\pm 5\%$ over a large area (e.g. approximately 400cm$^2$ for the TFTR design). It is very desirable for the source to generate a high percentage of atomic ions and to operate with a high gas efficiency.

In a high-current discharge the cathode is the most important design consideration; in prior sources, such as exemplified by above-referenced U.S. Pat. No. 3,846,668, this consists of an array of hot tungsten filaments around the periphery. Also, a source with ac-heated filaments has been operated for pulse lengths up to 10 seconds, but despite special winding of these filaments there remained a $\pm 8\%$ 120 Hz modulation of the plasma density, for a 56 filament device, an effect caused by the alternating magnetic field of the combined heater and emission currents that exist near the surface of the filaments. To eliminate this plasma-density variation, the return to dc-heated filaments was necessary, but a need exists for a plasma generator using dc-heated filaments which has the capacity and efficiency to meet the requirements of a neutral-beam system.

SUMMARY OF THE INVENTION

The present invention provides an improved plasma generating device which utilizes dc-heated filaments and utilizes the unavoidable magnetic field of the filaments to shield the side wall of the source from electrons by orienting the hairpin-shape filaments such that all the negative-potential legs are located on an inner line (radius or row) and the positive-potential legs on the outer line (radius or row) of the filament configuration (circular or retangular). Thus, the present invention overcomes the above-mentioned problems of the prior plasma generators while providing an efficient generator capable of handling the requirements of the neutral-beam systems, in that it produces a dense uniform plasma that is reproducible from pulse to pulse and free from noise. In addition, the geometry is very compact, an important consideration when a number of sources are stacked to inject into a common entrance port.

Therefore, it is an object of this invention to provide an improved plasma generating device.

A further object of the invention is to provide a plasma generating device utilizing dc-heated filaments positioned to create a solenoidal magnetic field to shield the chamber wall from electrons.

Another object of the invention is to provide a plasma generating device using hairpin-shaped filaments positioned around the chamber wall in a manner so as to produce a dense and uniform plasma that is reproducible from pulse to pulse and free from noise.

Another object of the invention is to provide a plasma generating device having the capacity and efficiency to meet the requirements of a neutral-beam injection system.

Other objects of the invention will become readily apparent from the following description and accompanying drawings.

BRIEF DESCRIPTION OF THE DRAWINGS

FIG. 4 illustrates an embodiment of the filament arrangement of a prior art plasma generator;

FIG. 5 illustrates an embodiment of an annular filament arrangement of the plasma generator made in accordance with the invention;

FIG. 6 illustrates an embodiment of a rectangular filament arrangement of the plasma generator made in accordance with the invention;

FIGS. 7 and 8 illustrate the advantage spacewise of a multiple rectangular configured plasma generator compared to a multiple annular configured generator for a specific packing factor; and FIG. 9 illustrates the profile in long dimension of a rectangular configured plasma generator made in accordance with the present invention.

DESCRIPTION OF THE INVENTION

The invention is directed to a plasma generating device which is particularly applicable in neutral-beam injection systems. The plasma generator of this invention provides a significant improvement by positioning the filaments so that they produce closed magnetic field lines near the wall of the generator chamber which function to shield the wall from electrons which normally would be lost to the walls, thereby resulting in a very uniform plasma density profile which is noise-free.

As pointed out above, the next generation of fusion systems will utilize neutral-beam injection for plasma heating, with requirements that considerably exceed the capacity of presently known plasma generators.

The components of a neutral-beam system are shown schematically in FIG. 1 and the system operation is as follows: A deuterium plasma is created in the plasma generator by means of a high-current arc discharge. Ions from this plasma are accelerated in a carefully designed multi-electrode structure. The ions then pass through a neutralizer containing deuterium gas and a fraction becomes neutralized by charge-exchange collisions. Remaining ions are removed from the beam by the sweep magnets; otherwise, the various reactor magnetic fields would bend the ions into surfaces near the entrance port, possibly releasing gas bursts or melting the surfaces. The considerable power in this ion beam must be handled by the ion-beam dump. The vacuum pumps distributed along the beam line remove most of the gas emerging from the neutralizer and the ion-beam dump and must maintain the pressure between the sweep magnet and the entrance port at a sufficiently low value that very little of the neutral beam is reionized. Well-regulated power supplies are required to assure good beam optics; to minimize accelerator damage when a spark occurs, the power supplies must also be capable of rapid turn-off with a minimum of stored energy (e.g., in cable capacitance). Optical, mechanical, and electrical sensors determine the condition and performance of the neutral-beam system and permit the control system to adjust the power-supply voltages and to shut down the system if a malfunction occurs.

Figure 1:
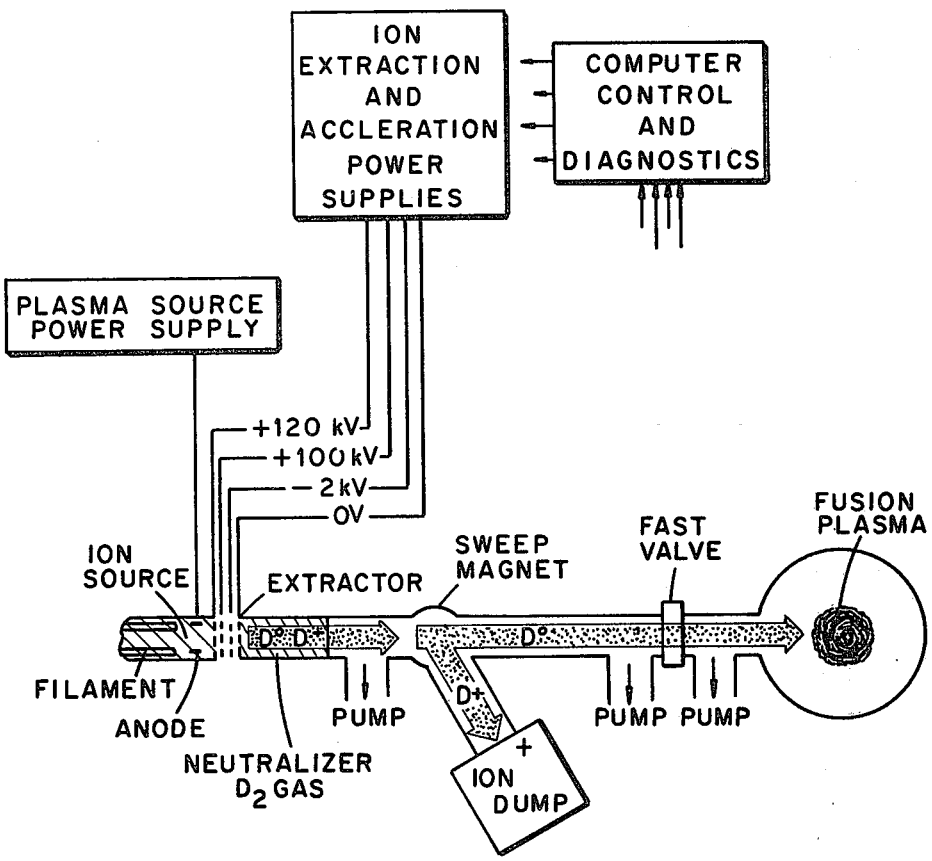
FIG. 1 is a schematic illustration of a typical neutral-beam injection system utilizing the invention.

The plasma generator, or ion source, has to provide, for the FIG. 1 neutral-beam injection system, a hydrogen or deuterium ion-current density, for example, of 0.25 to 0.5 A/cm$^2$, with combined spatial and temperal variations less than ±5% over a large area, such as approximately 400 cm$^2$ for the aforementioned TFTR system. It is thus very desirable for the source to generate a high percentage of atomic ions and to operate with a high gas efficiency. The plasma generator of this invention (see FIGS. 3, 5 & 6) has a high-current low-voltage discharge with no externally applied magnetic fields. The advantages of this type of discharge are that it produces a dense and uniform plasma that is reproducible from pulse to pulse and free from noise. In addition the geometry is very compact, an important consideration when a number of sources are stacked to inject into a common entrance port. In the plasma generator of this invention an array of hairpin-shaped (U-shaped) dc-heated tungsten filaments are located around the periphery of, or along the length of, the chamber and are oriented such that all the negative-potential legs are located on the inner radius or inner row (line) and the positive-potential legs on the outer radius or outer row (line) of the filament circle or rectangle (see FIGS. 5 and 6). With this filament orientation, a surface magnetic field is generated sufficient to reflect energetic electrons which normally would be lost to the walls of the chamber. The plasma is thus partially contained on the inside of the filament ring or row where the magnetic field is very weak or non-existent.

Figure 2:
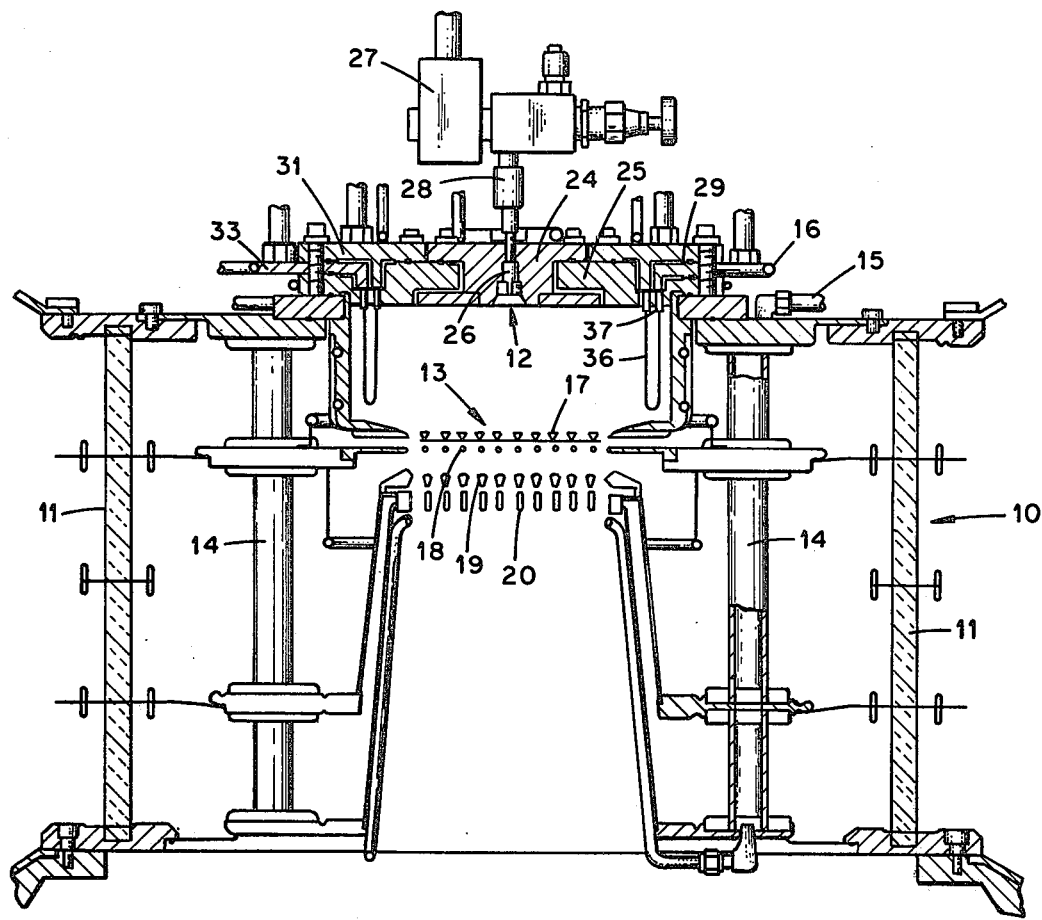
FIG. 2 is an embodiment of a 120-kV, 15-A, 0.5 sec. module for use with the neutral-beam injection system of FIG. 1 incorporating an annularly configured plasma generator of the invention.

An accelerator comprising a 15-A, 120-kV, 0.5-sec. module, incorporating the annular configured plasma generator of this invention, is shown in FIG. 2. The accelerator, generally indicated at 10, consists of an outer, vacuum-wall insulator 11 that is sectioned to distribute the potential gradients; the keep these insulators reasonably short, the outside of insulator 11 is pressurized with two atmospheres (absolute) of SF$_6$.

Mounted on an inner plug-in structure are the plasma generator, generally indicated at 12, and a grid assembly, generally indicated at 13, via tubular insulators 14 which also carry cooling water from a source indicated at 15 to the plates that support three of the four grids; with cooling for the fourth grid obtained from the plasma-source body coolant connected to a source via cooling tube 16.

The grid assembly 13 is composed of a first or source (beam-forming) grid 17, a gradient grid 18, a suppressor grid 19, and an exit grid 20, grids 18, 19 and 20 being cooled via coolant carried by tubular insulators 14, as illustrated.

Figure 3:
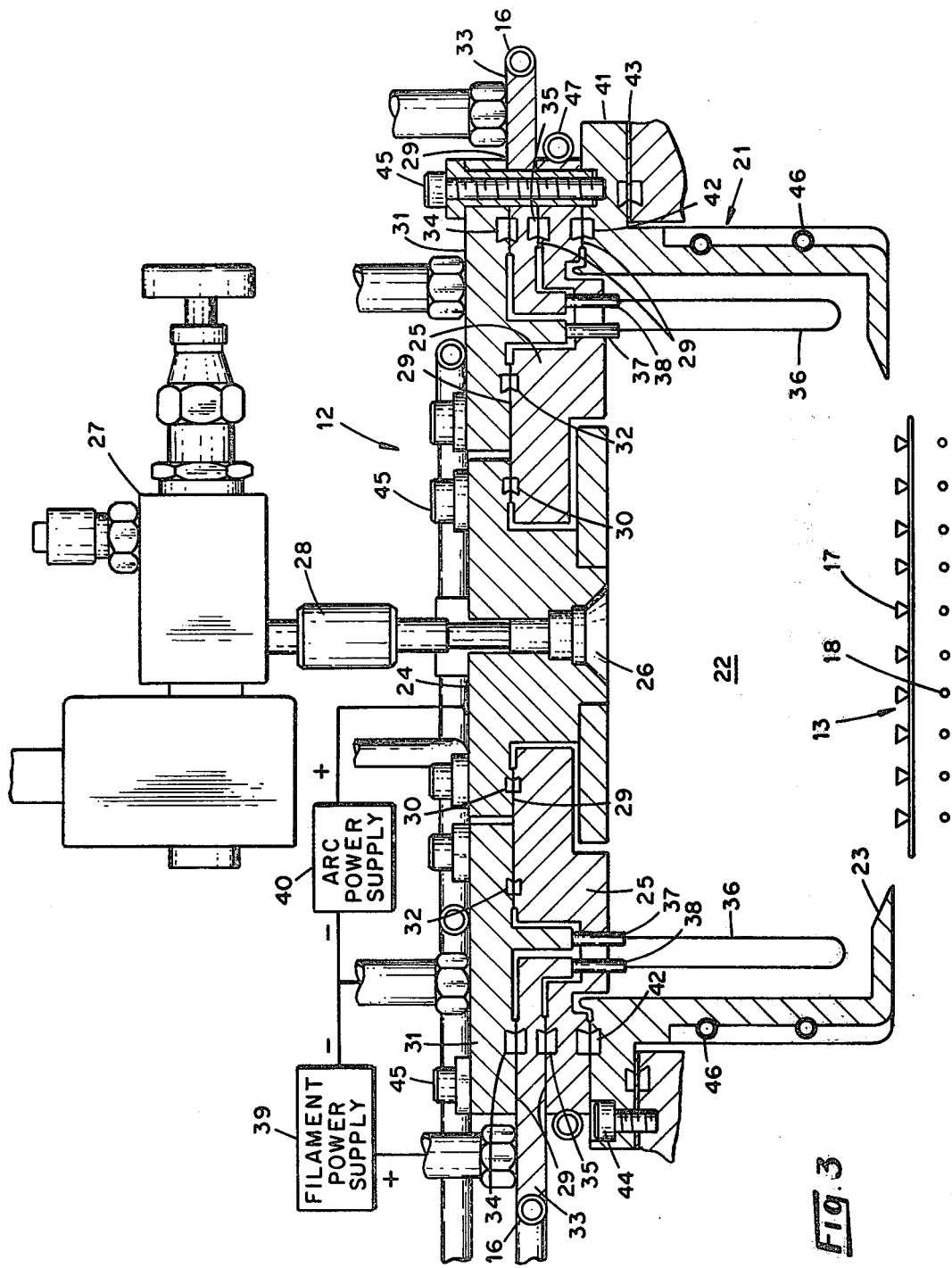
FIG. 3 is an enlarged partial cross-sectional view of the plasma generator of the FIG. 2 module.

The plasma generator 12, see FIGS. 2 and 3, comprises a housing or vessel 21 defining therein an arc discharge and plasma forming chamber 22 having an opening 23 adjacent source grid 17 of grid assembly 13. Housing 21 is closed opposite opening 23 by a centrally positioned anode 24 secured to a cathode cover plate 25 surrounding anode 24, with anode 24 having a central passageway 26 therethrough connected to a pulsed gas valve 27 via a gas inlet with diffuser 28 for supplying a pressurized gaseous medium, such as hydrogen, deuterium, tritium, and mixtures thereof from a source, not shown, in selected amounts into chamber 22 to be ionized. Insulator material 29, such as 0.005 inch thick Kapton, and O-ring seal 30 are positioned intermediate anode 24 and cathode cover plate 25. A negative (−) filament plate 31 is secured to cathode cover plate 25 with insulator material 29 and an O-ring 32 positioned therebetween. A positive (+) filament plate 33 is secured intermediate cathode cover plate 25 and negative filament plate 31 with insulator material 29 and O-rings 34 and 35 located therebetween. A plurality of plural-legged or hairpin-shaped filaments 36 (only two shown) are electrically connected to filament plates 31 and 33 via filament chucks 37 and 38, respectively. The filament, for example, may be made of 0.5 mm-diameter tungsten wires.

Figures 4, 5:
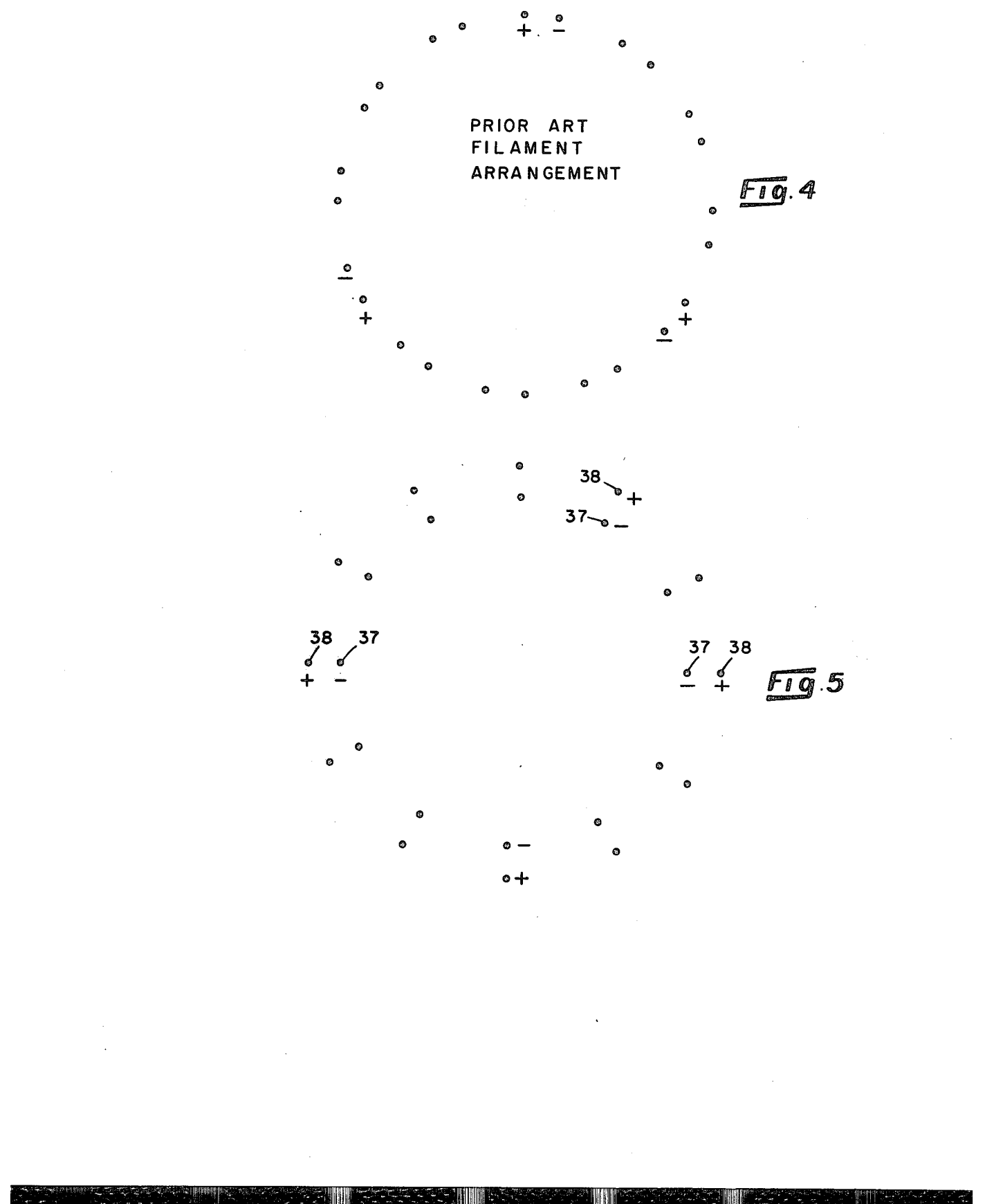

As set forth above, and more readily seen in FIG. 5, the filaments 36 are located around the periphery of chamber 22 and are oriented such that all the negative-potential legs are located on the inner radius (line) and the positive-potential legs on the outer radius (line) of the filament circle which create a ring magnetic field between the two legs of the filaments sufficient to reflect energetic electrons which normally would be lost to the walls of housing 21, with the plasma being partially contained on the inside of the filament ring where the magnetic field is very weak or non-existent. While only twelve (12) filaments are illustrated in FIG. 5, the orientation of the filament legs allow a large number of filaments to be utilized in the same space, when compared to the prior filament arrangement, such as taught in above-referenced U.S. Pat. No. 3,846,668, as illustrated in FIG. 4. For example, a plasma generator made in accordance with this invention, and tested, utilizes a 15 cm-diameter chamber with 56 filaments therein.

A filament power supply 39 (voltage of 10 to 15) is electrically connected to the negative and positive filament plates 31 and 33, while an arc power supply 40 (voltage of 30 to 80) is electrically connected between anode 24 and the negative filament plate 31.

The wall surface of housing 21 constitutes a wall electrode 41 secured to cathode cover plate 25 with insulator material 29 and an O-ring 42 positioned therebetween, electrode 41 being connected to a power source not shown, and mounted on inner plug-in structure 10 via a gap space adjusting spacer 43 (which sets or allows adjustment of the gap) by mounting means, such as bolts 44 (only one shown), with bolts 45 securing cathode cover plate 25, negative filament plate 31, and positive filament plate 33 to wall electrode 41. Wall electrode 41 is cooled by coolant in tubes 46 extending thereabout and connected to cooling tube 16, while a coolant in a tube 47 extending around cathode cover plate 25 and connected to cooling tube 16 serves to cool that plate, with cooling tube 16 encircling the positive filament plate 32 for cooling same.

As mentioned above, a 56 filament embodiment of the annular configuration of the present invention has been built and tested with the results having been presented in a paper entitled "120-keV Neutral-Beam Injection System Development" by K. W. Ehlers et al presented at the 9th Symposium on Fusion Technology, Garmisch, Germany, June 14–18, 1976.

FIG. 6 illustrates an embodiment of a rectangularly configured plasma generator chamber 22' wherein the hairpin-shaped filaments are aligned in two spaced rows (lines) with the negative-potential chucks 37' being on the inner rows while the positive potential chucks 38' are on the outer rows. Since asymmetry is important, there are no filaments at the ends, as seen in FIG. 6, but the housing 21' forming chamber 22 is made longer than the desired extract area, as seen in FIG. 9, so that the end loss region is out of the extract zone.

By a comparison of FIGS. 7 and 8, it can be readily seen that for a fixed available area of a selected rectangular configuration, the rectangular plasma generators of FIG. 6 can be stacked to more effectively accommodate this shape and produce a greater extract area than can the annular or circular plasma generators of FIG. 5.

By way of example an embodiment of the rectangular configuration of 10 cm × 40 cm (400 cm$^2$) has been built and tested for use in the above-mentioned TFTR, using 204 filaments (102 on each side of chamber) —5000A — 11.5 v arc = 40 v at 2000A — for plasma density of 0.25A/cm$^2$ for deuterium — same current gives 0.31A/cm$^2$ for hydrogen. Plasma density was uniform to ±5% over 10 × ~45 cm = 450 cm$^2$.

The rectangular configured source of FIG. 6 can be made any length, such as 10 cm × 60 cm, and with extract geometry of 60% transparent, it will put out 10 cm × 60 cm × 0.6 × 0.25A/cm$^2$ = 90 ampere ion beam.

As extension of the "on" time is required for the above, one needs more filaments — at $\frac{1}{2}$ sec. one can take ~ $\frac{1}{2}$ the heater current in arc current — without "time" effects. So 25A/2 = heater current = ≈ 10A/filaments × 204 = X 2000 + amps. arc current. If they need much longer arc "on" times than $\frac{1}{2}$ sec — one will need even more filaments, with the above-described arrangement being okay up to a few seconds.

While not shown, in the rectangular configuration the centrally positioned anode 24 in FIG. 3 is replaced by a plurality of longitudinally spaced anodes (3, for example, in the above described 204 filament embodiment) and the chamber 22 is rectangular in configuration, with the components forming housing or vessel 21 being configured to form a rectangular shaped chamber therein, with the filaments 36 positioned on opposite sides of the chamber and functioning in a manner as described above with respect to the FIGS. 3 and 5 annular configured embodiment.

It has thus been shown that the present invention provides an improved ion source or plasma generating device for use in high current neutral-beam injection systems used to heat and fuel controlled fusion reactors. The improved generating device uses an arrangement of filaments which creates a solenoidal magnetic field within the generator chamber to shield the chamber side wall from electrons. This results in a more efficient plasma generator which has a more uniform plasma density profile and is noise free.

While particular embodiments have been illustrated and/or described, modifications and changes will become apparent to those skilled in the art, and it is intended to cover in the appended claims all such modifications as come within the spirit and scope of the invention.

What I claim is:

1. A plasma generating device providing a uniform plasma density profile which is noise-free by utilizing closed magnetic field lines near the generator chamber wall which function to shield the wall from electrons comprising: a vessel means defining therein an arc discharge and plasma forming chamber open at one end thereof, said vessel means being closed at an opposite end thereof by a centrally located anode plate means secured to and electrically insulated from a cathode cover plate means, seal means located intermediate said anode plate means and said cathode cover plate means, said cathode cover plate means being secured to and electrically insulated from a wall surface forming member of said vessel means, seal means located intermediate said cathode cover plate means and said wall surface forming member, a negative-potential filament plate means secured to and electrically insulated from said cathode cover plate means, seal means located intermediate said negative-potential filament plate means and said cathode cover plate means, a positive-potential filament plate means secured between and electrically insulated from said negative-potential filament plate means and said cathode cover plate means, seal means located intermediate said positive-potential filament plate means and each of said negative-potential filament plate means and said cathode cover plate means, said anode plate means being provided with a central opening through which gaseous medium to be ionized in said chamber is admitted into said chamber, a plurality of plural-legged, hairpin-shaped, dc-heated filaments electrically connected by a plurality of filament chuck means to substantially parallel protruding portions of said negative and positive-potential filament plate means, said filament chuck means each extending only through apertures in said cathode cover plate means and into said chamber, said filaments being positioned along at least portions of the periphery of said chamber and spaced from said wall surface forming member and arranged such that one leg of each filament is electrically connected via one of said chuck means to said negative-potential filament plate means and another leg of each of said filaments is electrically connected via another of said chuck means to said positive-potential filament plate means such that said legs of said filaments connected to said negative-potential plate means are located on an inner line of a double line filament configuration and the legs of said filaments connected to said positive-potential plate means are located on an outer line of such a filament configuration, a first power supply means operatively connected to said anode plate means, and a second power supply means operatively connected to said negative-potential and positive-potential plate means, whereby direct-current flow through said filaments generate a magnetic field to shield said wall surface forming member from electrons.

2. The plasma generating device defined in claim 1, wherein said filaments are constructed of tungsten.

3. The plasma generating device defined in claim 1, additionally including means connected to said central opening in said anode plate means for supplying to said chamber gaseous medium to be ionized selected from the group consisting of hydrogen, deuterium, tritium and mixtures thereof.

4. The plasma generating device defined in claim 1, wherein said chamber is of a substantially annular configuration, and wherein said filaments are positioned around the periphery thereof.

5. The plasma generating device defined in claim 1, wherein said chamber is a rectangular configuration, and wherein said filaments are positioned only along the longitudinal length thereof.

* * * * *